United States Patent
Nielsen et al.

(10) Patent No.: US 12,319,767 B2
(45) Date of Patent: Jun. 3, 2025

(54) FORMING ESTER-SUBSTITUTED POLYMERS FOR ORGANIC PHOTOVOLTAICS

(71) Applicant: PHILLIPS 66 COMPANY, Houston, TX (US)

(72) Inventors: Laura Nielsen, Bartlesville, OK (US); Reed Eisenhart, Bartlesville, OK (US); Victoria Suding, Bartlesville, OK (US); Alyssa Brooke Chinen-Mendez, Wexford, PA (US); Brian J. Worfolk, Raleigh, NC (US); Zach L. Cramer, Bartlesville, OK (US); Hualong Pan, Bartlesville, OK (US)

(*) Notice: Subject to any disclaimer, the term of this patent is extended or adjusted under 35 U.S.C. 154(b) by 543 days.

(21) Appl. No.: 17/903,720

(22) Filed: Sep. 6, 2022

(65) Prior Publication Data

US 2023/0086615 A1    Mar. 23, 2023

Related U.S. Application Data

(60) Provisional application No. 63/242,688, filed on Sep. 10, 2021.

(51) Int. Cl.
*H01B 1/00* (2006.01)
*C08F 28/06* (2006.01)
(Continued)

(52) U.S. Cl.
CPC ............ *C08F 28/06* (2013.01); *H01B 1/124* (2013.01); *H10K 85/113* (2023.02)

(58) Field of Classification Search
CPC . H01B 1/00; H01B 1/12; H01B 1/124; H01B 1/127; H01B 1/128; C08F 28/06; H10K 85/113; C08G 61/122
See application file for complete search history.

(56) References Cited

U.S. PATENT DOCUMENTS

2015/0333265 A1* 11/2015 Welker .................. C09B 57/004
549/4

FOREIGN PATENT DOCUMENTS

CN           104513512 A  *  4/2015  ........... C07D 495/04
WO   WO-2020178796 A1  *  9/2020  ........... C07D 519/00

OTHER PUBLICATIONS

Cinar et al "Thienothiophenes, Dithienothiophenes, and Thienoacenes: Syntheses, Oligomers, Polymers, and Properties", Chem. Rev. 2015, 115, 3036-3140.*

(Continued)

*Primary Examiner* — Mark Kopec
(74) *Attorney, Agent, or Firm* — Phillips 66 Company

(57) ABSTRACT

A method comprised of combining

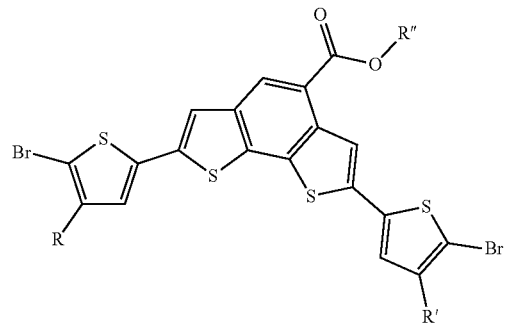

$Me_3Sn$—X—$SnMe_3$ to form a solution containing a polymer (Continued)

(51) Int. Cl.
   H01B 1/12      (2006.01)
   H10K 85/10     (2023.01)

(56) References Cited

OTHER PUBLICATIONS

Andrea Nittli Gabriele Blanchi, Riccardo Po, Darlo Pasini "Scalable Synthesis of Naththothiophene and Benzodithiophene Scaffolds as π-Conjugated Synthons for Organic Materials", Synthesis Feature, 2019, vol. 51, pp. 677-682.

* cited by examiner

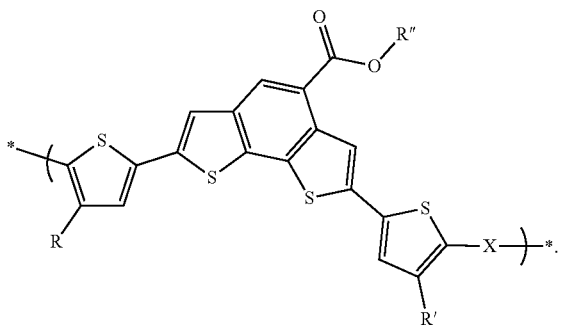

In this polymer R, R', and R" are independently selected from the group consisting of: H, Cl, F, CN, alkyl, alkoxy, alkylthio, ester, ketone and aryl groups; and X is selected from aryl groups.

15 Claims, 10 Drawing Sheets

ITIC-DF

EH-IDTBR

FORMING ESTER-SUBSTITUTED POLYMERS FOR ORGANIC PHOTOVOLTAICS

CROSS-REFERENCE TO RELATED APPLICATIONS

This application is a non-provisional application which claims the benefit of and priority to U.S. Provisional Application Ser. No. 63/242,688 filed Sep. 10, 2021, entitled "Forming Ester-Substituted Polymers for Organic Photovoltaics," which is hereby incorporated by reference in its entirety.

STATEMENT REGARDING FEDERALLY SPONSORED RESEARCH OR DEVELOPMENT

None.

FIELD OF THE INVENTION

This invention relates to ester-substituted polymers for organic photovoltaics.

BACKGROUND OF THE INVENTION

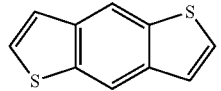

Benzo[1,2-b:4,5-b']dithiophene s has been used extensively in organic electronic applications and contained in many high-performing polymers developed by many leaders in the organic photovoltaic space. Other isomers of benzodithiophene, such as benzo[2,1-b:3,4-b']dithiophene

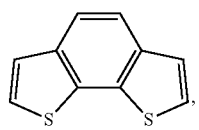

have been studied significantly less frequently.

References such as 9550791 and WO2020178796 have previously tried to utilize ester-substituted benzo[2,1-b:3,4-b']dithiophene as a polymer backbone connected to a single thiophene to produce a repeat unit. This resulted in power conversion efficiencies of 4.74-5.14% when paired with acceptor PC70BM using conventional OPV device architecture and power conversion efficiencies of 4.97% when tested with PC60BM used with inverted device architecture. These power conversion efficiencies are moderate at best. There exists a need to design novel ester-substituted benzo[2,1-b:3,4-b']dithiophene polymers.

BRIEF SUMMARY OF THE DISCLOSURE

A method comprised of combining

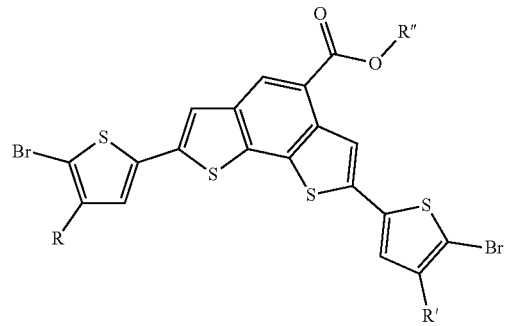

$Me_3Sn$—X—$SnMe_3$ to form a solution containing a polymer

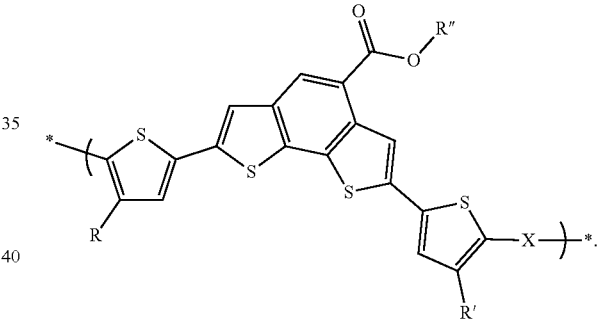

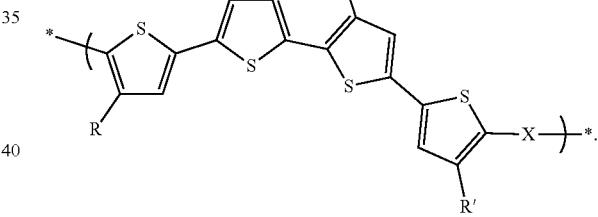

In this polymer R, R', and R" are independently selected from the group consisting of: H, Cl, F, CN, alkyl, alkoxy, alkylthio, ester, ketone and aryl groups; and X is selected from aryl groups.

An alternate method comprised of combining

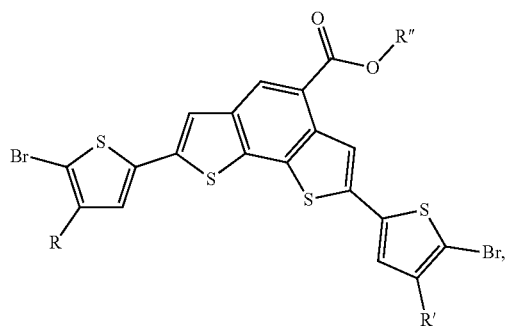

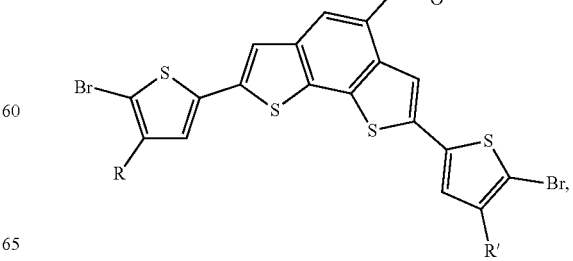

Me₃Sn—X—SnMe₃, and Me₃Sn—X'—SnMe₃ to form

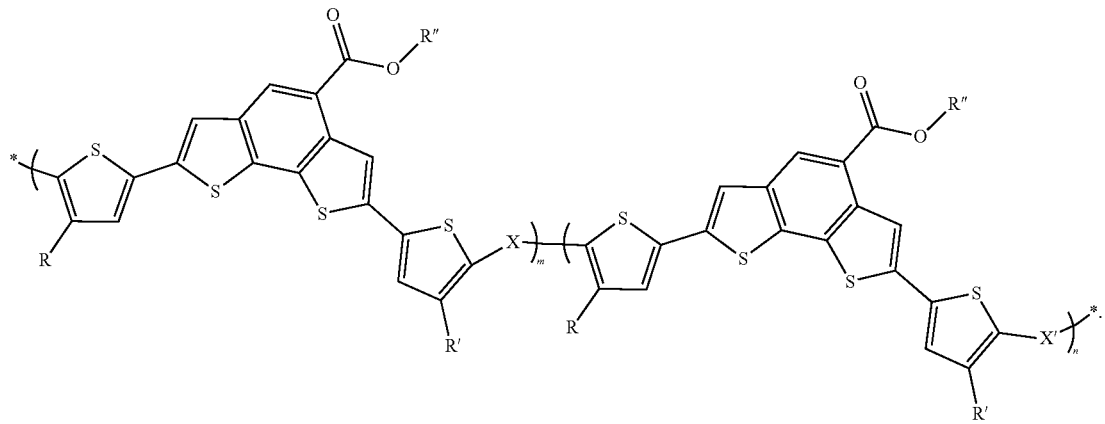

In this polymer, R, R', and R" are independently selected from the group consisting of: H, Cl, F, CN, alkyl, alkoxy, alkylthio, ester, ketone and aryl groups. Additionally, in this polymer X and X' are independently selected from aryl groups. Finally, m independently ranges from 1 to 100 percent and n independently ranges from 0 to 99 percent.

BRIEF DESCRIPTION OF THE DRAWINGS

A more complete understanding of the present invention and benefits thereof may be acquired by referring to the following description taken in conjunction with the accompanying drawings in which.

DETAILED DESCRIPTION

Figure 1:
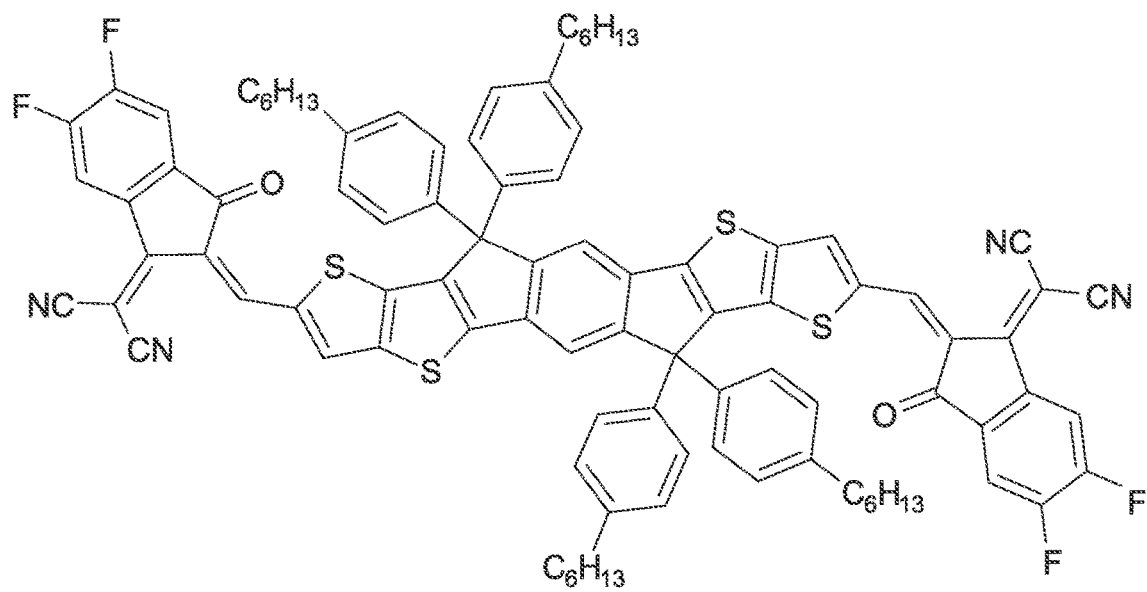
FIG. 1 depicts two non-limiting examples of non-fullerene acceptors.
Figure 1:
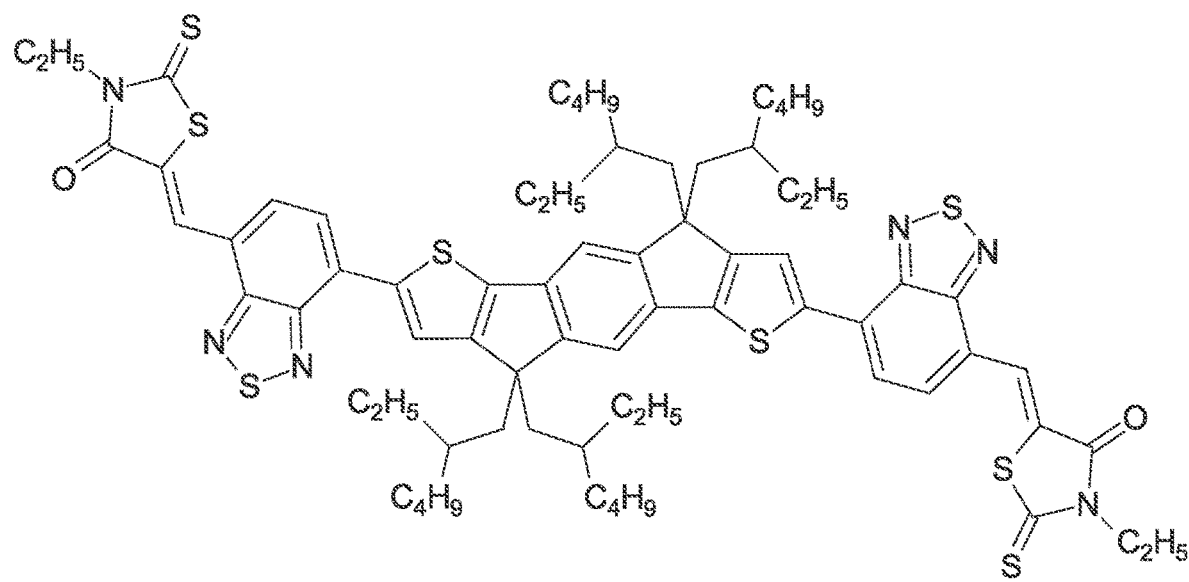

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, and includes straight and branched chained, single, double and triple bonded carbons such as methyl, ethyl, n-propyl, isopropyl, n-butyl, isobutyl, sec-butyl, t-butyl, n-pentyl, isopentyl, neo-pentyl, n-hexyl, isohexyl, propenyl, butenyl, pentenyl, hexenyl, butadienyl, pentadienyl, hexadienyl, ethynyl, propynyl, butynyl, pentynyl, hexynyl, 2-ethylhexyl, 2-butyloctyl, 2-hexyldecyl, 2-octyldodecyl, 2-decyltetradecyl and the like. In this application alkyl groups can include the possibility of substituted and unsubstituted alkyl groups. Substituted alkyl groups can include one or more halogen substituents.

"Alkoxy," as used herein, refers to the group R—O— where R is an alkyl group of 1 to 100 carbon atoms. Examples of alkoxy groups include, but are not limited to, methoxy, ethoxy, propoxy (e.g., n-propoxy and isopropoxy), t-butoxy, pentoxyl, hexoxyl groups, and the like. In this application alkoxy groups can include the possibility of substituted and unsubstituted alkoxy groups.

"Alkylthio" as used herein refers to a —S— alkyl group. Examples of alkylthio groups include, but are not limited to, methylthio, ethylthio, propylthio (e.g., n-propylthio and isopropylthio), t-butylthio, pentylthio, hexylthio groups, and the like. In this application alkylthio groups can include the possibility of substituted and unsubstituted alkylthio groups.

"Aryl" as used herein, refers to an optionally substituted, mono-, di-, tri-, or other multicyclic aromatic ring system having from about 3 to about 50 carbon atoms (and all combinations and subcombinations of ranges and specific numbers of carbon atoms therein), with from about 3 to about 15 carbons being preferred. Non-limiting examples include, for example, phenyl, naphthyl, anthracenyl, and phenanthrenyl. Aryl groups can be optionally substituted with one or with one or more $R_X$. In this application aryl groups can include the possibility of substituted aryl groups, bridged aryl groups and fused aryl groups. As used herein aryl groups also include heteroaryls, including structures with more than one heteroatom. Non-limiting examples of heteroatoms that can be heteroaryls include B, N, O, Al, Si, P, S, Ge, Bi, Te, Sn, and Se. Some non-limiting examples of aryl groups with heteroaryls include: thiophene, pyridine, pyrrole, furan, stibole, arsole selenophene, imidazole, pyrazole, oxathiole, isoxathiole, thiazole, triazole, thiadiazole, diazine, oxazine, indole, and thiazine.

Fill Factor (FF) as used herein, is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation: $FF=(V_{mp}*J_{mp})/(J_{sc}*V_{oc})$ where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells.

Open-circuit voltage ($V_{oc}$) as used herein, is the difference in the electrical potentials between the anode and the cathode of a device when there is no external load connected.

Power conversion efficiency as used herein, of a solar cell is the percentage of power converted from absorbed light to electrical energy. The power conversion efficiency of a solar cell can be calculated by dividing the maximum power point ($P_m$) by the input light irradiance (E, in W/m$^2$) under standard test conditions and the surface area of the solar cell ($A_c$ in m$^2$). standard test conditions typically refers to a temperature of 25° C. and an irradiance of 1000 W/m$^2$ with an air mass 1.5 (AM 1.5 G) spectrum.

Random as used herein, refers to a chemical whose structural composition is a statistical mixture of different subunits or subunit orientations formed statistically during the chemical synthesis. The exact structural composition of each molecule resulting from the synthesis could be therefore distinct, but the composition of the product is most accurately described via a description that details the possible substitutions or orientations in a statistical mixture determined by the stoichiometry of the reactants. Random when used in conjunction with copolymers refers to polymers in which the monomer residues are located and/or oriented randomly within the chain of the polymer molecule, in which the probability of finding a given monomer residue at any given site depends only on the relative proportion of that comonomer in the reaction mixture. Non-limiting examples of random copolymers can include: 1) Linear polymers that are randomized only in relation to the orientation of asymmetric monomer residues along the polymer backbone, e.g. a statistical mixture of head-to-head, head-to-tail and tail-to-tail arrangement in the polymer backbone. Sometimes known as regiorandom polymers. 2) More than two different comonomers randomly located in the polymer structure. In one non-limiting example, a polymer formed from a reaction in which reactant A can react with either reactant B or C, but B cannot react with C, the resulting polymer structure is a statistical mixture of ABA and ACA repeat units. This concept could be extended to between 2 and 50 unique comonomers. Structures of this type are drawn as $-(AB)_X-(AC)_Y-$ where X and Y denote the relative molar percentage of reagent B and C used in the polymerization reaction and add to 100%. 3) More than two different comonomers randomly located in the polymer structure in which one or more of the comonomers is asymmetric. In one example, a polymer formed from the reaction which reactant A is asymmetric and can be oriented in either the A+ or A− orientation can react with either reactant B or C, but B cannot react with C, the resulting polymer structure is a statistical mixture of A+BA+, A−BA−, A+BA−, A−BA+, A+CA+, A−CA−, A+CA−, and A−CA+ repeat units. Structures of this type are drawn as $-(AB)_X-(AC)_Y-$ where X and Y denote the relative molar percentage of reagent B and C used in the polymerization reaction and add to 100%, the random orientation of the asymmetric subunits is implied by the structure but not always explicitly drawn out.

The present application relates to polymeric compounds that can be used as organic semiconductor materials. The present compounds can have good solubility in various common solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit very high power conversion efficiency (e.g., about 7.0% or greater) and very high fill factor (e.g., about 68% or greater).

The present embodiment describes a polymer comprising

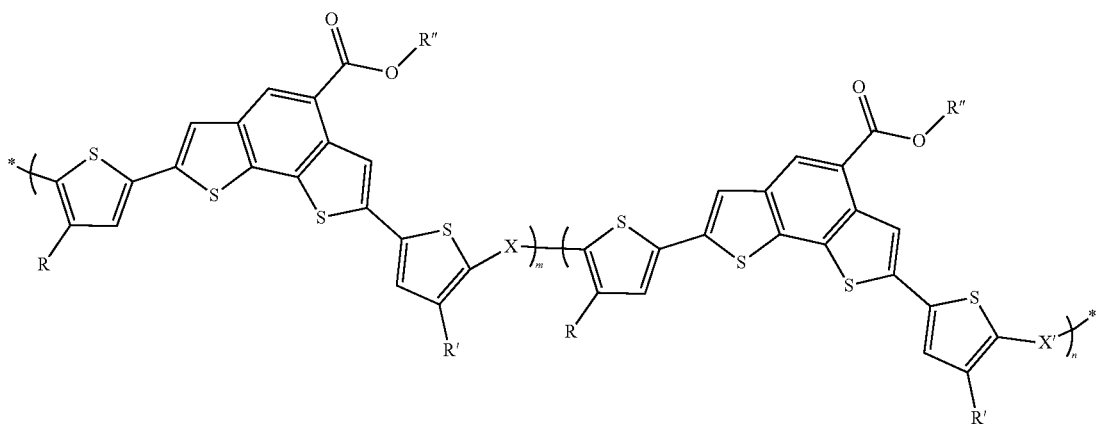

In this embodiment, R, R', and R" are independently selected from the group consisting of: H, Cl, F, CN, alkyl, alkoxy, alkylthio, ester, ketone and aryl groups. Additionally, X and X' are independently selected from aryl groups. Lastly, m independently ranges from 1 to 100 percent and n independently ranges from 0 to 99 percent.

In one embodiment, the molecular weight of the polymer can range from 1 to 200 kDa. In other embodiments, R and R' can be identical. In yet other embodiments, R, R', and R" are not identical. In some embodiments, X and X' are identical. In other embodiments, X and X' are not identical. In other non-limiting embodiments, the number of aryl groups in X and X' can be 1, 2, 3, 4, or any other number of aryl groups.

In some embodiments, the aryl groups are selected from

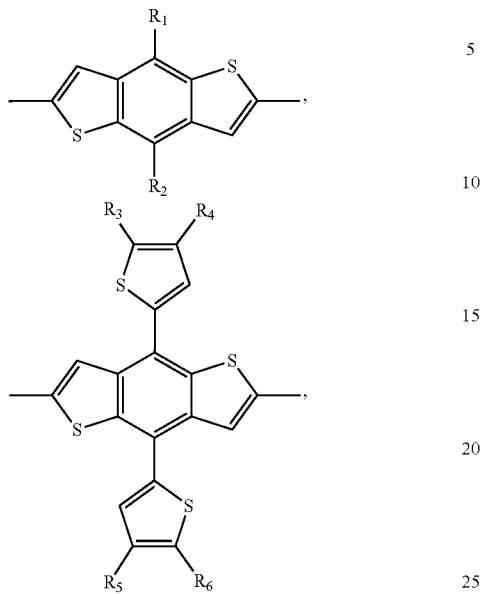

and combinations thereof. In these embodiments, $R_1$, $R_2$, $R_3$, $R_4$, $R_5$, and $R_6$ are independently selected from H, Cl, F, CN, alkyl, alkoxy, alkylthio, ester, ketone and aryl groups.

In yet another embodiment, a polymer comprising

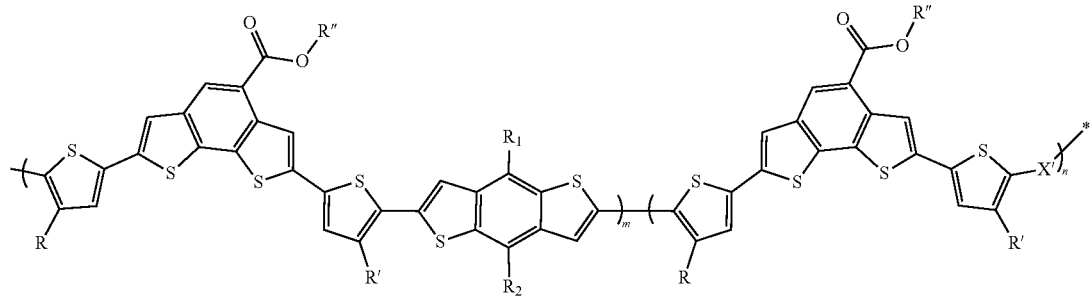

is described. In this embodiment, R, R', and R" are independently selected from the group consisting of: H, Cl, F, CN, alkyl, alkoxy, alkylthio, ester, ketone and aryl groups. Additionally, X' is selected from aryl groups. Furthermore, R1 and R2 are independently selected from H, Cl, F, CN, alkyl, alkoxy, alkylthio, ester, ketone and aryl groups. Lastly, m independently ranges from 1 to 100 percent and n independently ranges from 0 to 99 percent.

In another embodiment, a polymer comprising

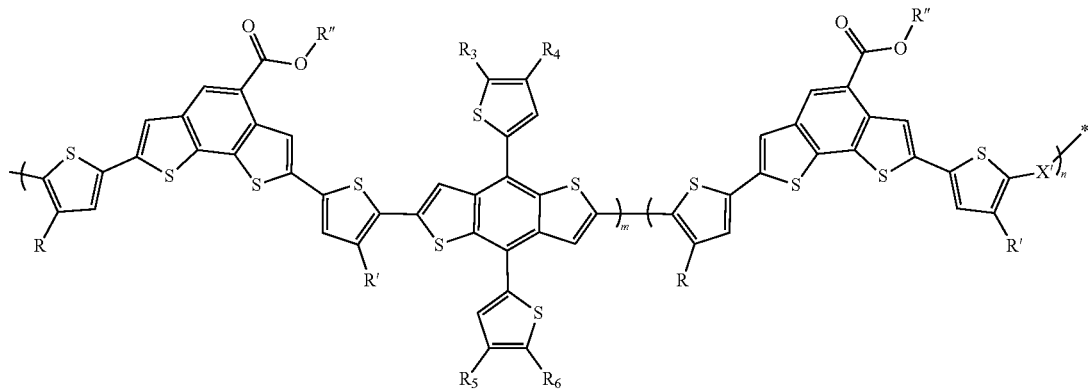

is described. In this embodiment, R, R', and R" are independently selected from the group consisting of: H, Cl, F, CN, alkyl, alkoxy, alkylthio, ester, ketone and aryl groups. Additionally, X' is selected from aryl groups. Furthermore, R3, R4, R5, and R6 are independently selected from H, Cl, F, CN, alkyl, alkoxy, alkylthio, ester, ketone and aryl groups. Lastly, m independently ranges from 1 to 100 percent and n independently ranges from 0 to 99 percent.

In alternate embodiments, a method is described where

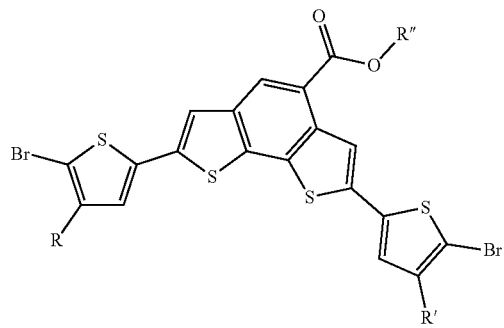

and Me₃Sn—X—SnMe₃ are combined to form a solution containing the polymer

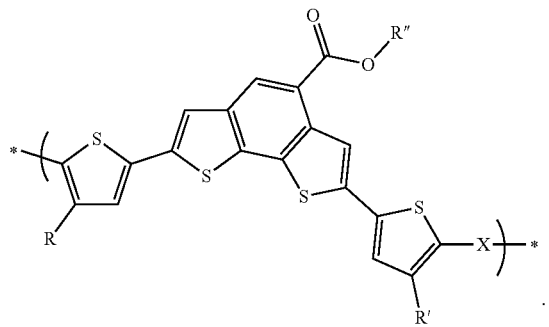

In this embodiment, R, R', and R" are independently selected from the group consisting of H, Cl, F, CN, alkyl, alkoxy, alkylthio, ester, ketone and aryl groups. Additionally, X is selected from aryl groups.

In one embodiment, the mole ratio of and Me₃Sn—X—SnMe₃ are substantially similar. Broadly defined substantially similar can mean within 10 mole percent of each other, within 5 mole percent of each other, within 3 mole percent of each other or even within 1 mole percent of each other.

In other embodiments, the method can combine tris(dibenzylideneacetone)dipalladium(0) and tri(o-tolyl)phosphine with

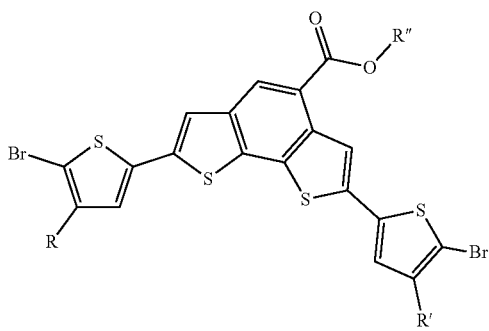

and Me₃Sn—X—SnMe₃.

In yet another embodiment, the solution can be heated to a temperature greater than 100° C. Or yet in other embodiments, greater than 110° C., 115° C., 120° C., 125° C., or even greater than 130° C. In another embodiment, the solution is purified to extract the monomer.

In one other embodiment, the method can comprise combining

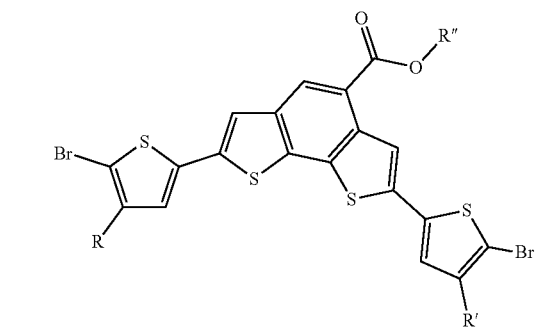

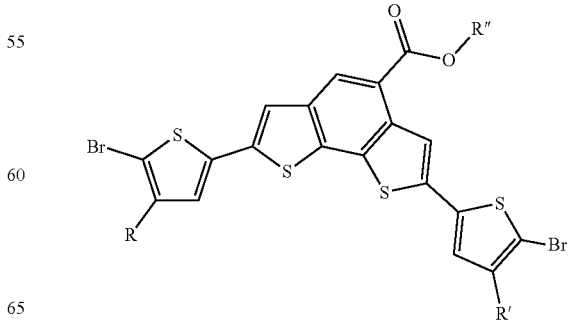

Me₃Sn—X—SnMe₃, and Me₃Sn—X'—SnMe₃ to form

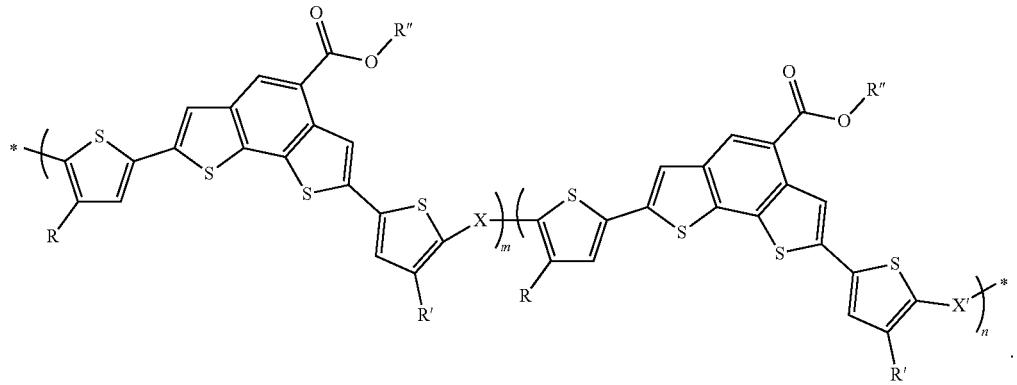

In this embodiment, R, R', and R" are independently selected from the group consisting of: H, Cl, F, CN, alkyl, alkoxy, alkylthio, ester, ketone and aryl groups. Additionally, X and X' are independently selected from aryl groups and m independently ranges from 1 to 100 and n independently ranges from 0 to 99.

As stated in all the above embodiments, m can range from 1% to 100% and n can range from 0% to 99%. In an alternate embodiment, m can range from 1% to 99% and n can range from 1% to 99%. These ranges of m and n are used to create a polymer with random units or monomer throughout the polymer chain. In some embodiments the m unit can be a minimum of 2, 3, 4, 5, or even 6 units in a row. Likewise, in some embodiments the n unit can be a minimum of 2, 3, 4, 5, or even 6 units in a row. In other embodiments, the m unit and n unit can be independently chosen from any known number.

The polymers or oligomers produced from the present disclosure can be used as part of a photovoltaic material or an active layer material in a photovoltaic device or an electronic device such as photodetector devices, solar cell devices, and the like. Photovoltaic devices, including solar cell devices, are generally comprised of laminates of a suitable photovoltaic material between a hole-collecting electrode layer and an electron-collecting layer. Additional layers, elements or a substrate may or may not be present. In one embodiment the electronic devices are field effect transistors, light emitting devices, and sensors, electrochromic devices and capacitors.

In one embodiment the polymer or oligomer is used for organic photovoltaic devices. In this embodiment the organic photovoltaic device comprises a cathode, disposed over an electron transport layer, disposed above a polymer or oligomer of the present teachings, disposed above an anode. In this embodiment the electron transport layer can comprise $(AO_x)_y BO_{(1-y)}$ with an optional fullerene dopant.

Anode

The anode for the organic photovoltaic device can be any conventionally known anode capable of operating as an organic photovoltaic device. Examples of anodes that can be used include: indium tin oxide (ITO), fluorine doped tin oxide (FTO), aluminum, silver, gold, carbon, carbon nanotubes, graphite, graphene, PEDOT:PSS, copper, metal nanowires or meshes, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, gold, aluminum, metal nanowires.

Electron Transport Layer

The electron transport layer of the organic photovoltaic device can be any conventionally known electron transport layer such as a $(SnO_x)_y ZnO_{(1-y)}$.

In other embodiments, the electron transport layer of the organic photovoltaic device comprises $(DO_x)_y EO_{(1-y)}$. In this embodiment, $(DO_x)_y$ and $EO_{(1-y)}$ are metal oxides. A and B can be different metals selected to achieve ideal electron transport layers.

In one embodiment D can be aluminum, indium, zinc, tin, copper, nickel, cobalt, iron, ruthenium, rhodium, osmium, tungsten, magnesium, indium, vanadium, titanium and molybdenum.

In one embodiment E can be aluminum, indium, zinc, tin, copper, nickel, cobalt, iron, ruthenium, rhodium, osmium, tungsten, vanadium, titanium and molybdenum.

Examples of $(DO_x)_y EO_{(1-y)}$ include: $(SnO_x)_y ZnO_{(1-y)}$, $(AlO_x)_y ZnO_{(1-y)}$, $(AlO_x)_y InO_{z(1-y)}$, $(AlO_x)_y SnO_{z(1-y)}$, $(AlO_x)_y CuO_{z(1-y)}$, $(AlO_x)_y WO_{z(1-y)}$, $(InO_x)_y ZnO_{(1-y)}$, $(InO_x)_y SnO_{z(1-y)}$, $(InO_x)_y NiO_{z(1-y)}$, $(ZnO_x)_y CuO_{z(1-y)}$, $(ZnO_x)_y NiO_{z(1-y)}$, $(ZnO_x)_y FeO_{z(1-y)}$, $(WO_x)_y VO_{z(1-y)}$, $(WO_x)_y TiO_{z(1-y)}$, and $(WO_x)_y MoO_{z(1-y)}$.

In one embodiment, $(DO_x)_y EO_{(1-y)}$ contains from about 10% to about 25% atomic % of acetate as characterized with x-ray photoelectron spectroscopy.

In one embodiment, the production of $(DO_x)_y EO_{(1-y)}$ occurs from reacting an organic D precursor in the amounts of (1−y); an organic E precursor in the amounts of y; and a base in the amount of (1−y) to 1.

Examples of fullerene dopants that can be combined with the electron transport layer include

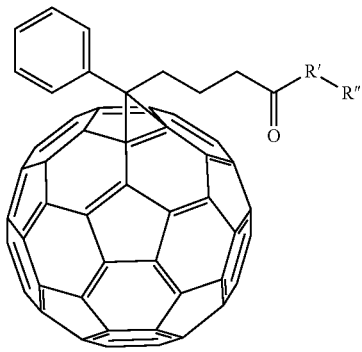

and [6,6]-phenyl-$C_{60}$-butyric-N-2-trimethylammonium ethyl ester iodide.

In the embodiment of

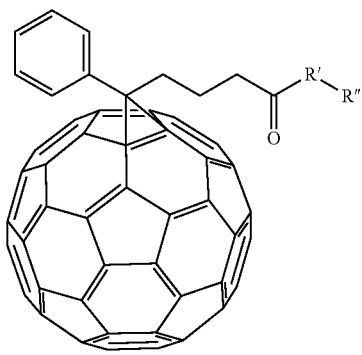

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

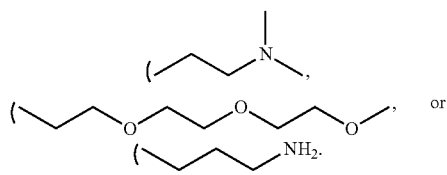

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-$C_{60}$-butyric-N-2-dimethylaminoethyl ester.

Acceptors

Non-fullerene acceptors were tested with the polymers. It is expected that all known types of non-fullerene acceptors would operate for all the embodiments described. It is theorized that by selecting acceptors that have complementary absorbance and energy levels increased PCE's will be achieved. Two non-limiting examples of non-fullerene acceptors are shown in FIG. 1.

The following examples of certain embodiments of the invention are given. Each example is provided by way of explanation of the invention, one of many embodiments of the invention, and the following examples should not be read to limit, or define, the scope of the invention.

Monomer Formation

Figure 2:
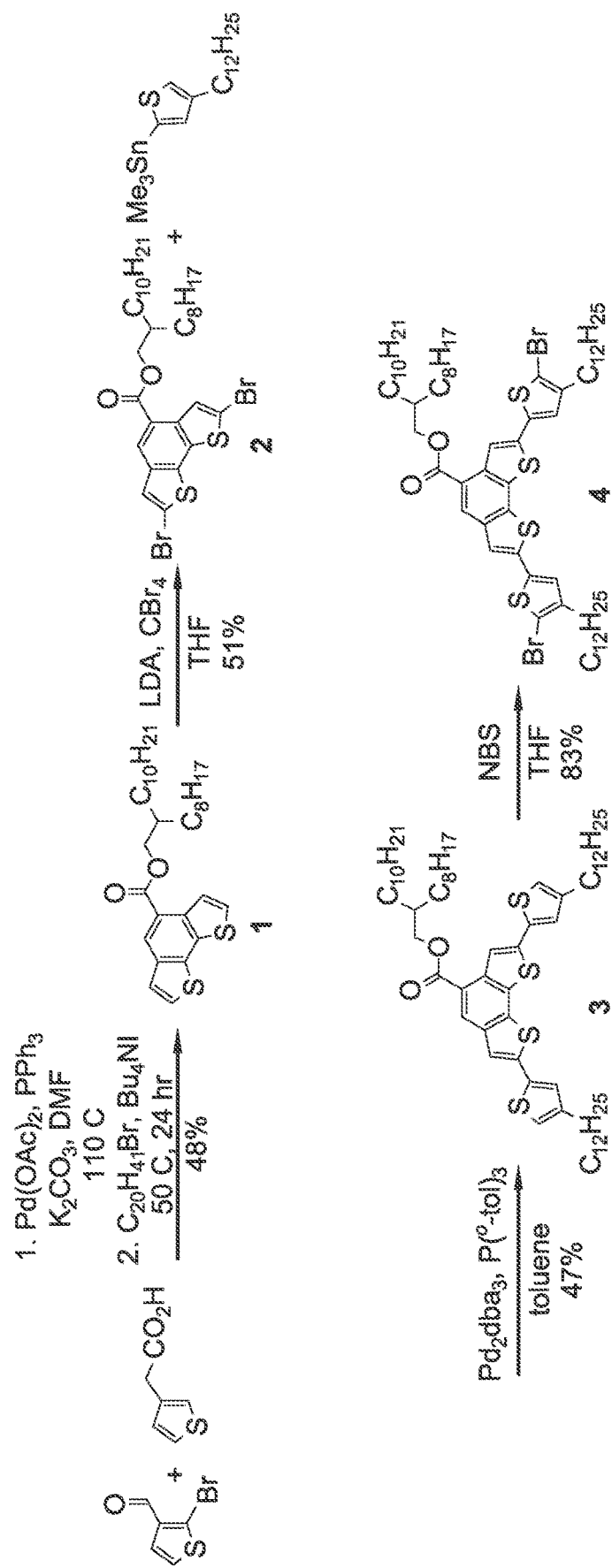
FIG. 2 depicts a representative synthesis of BDT ester monomer.

A representative synthesis of BDT ester monomer is shown in FIG. 2.

Figure 3:
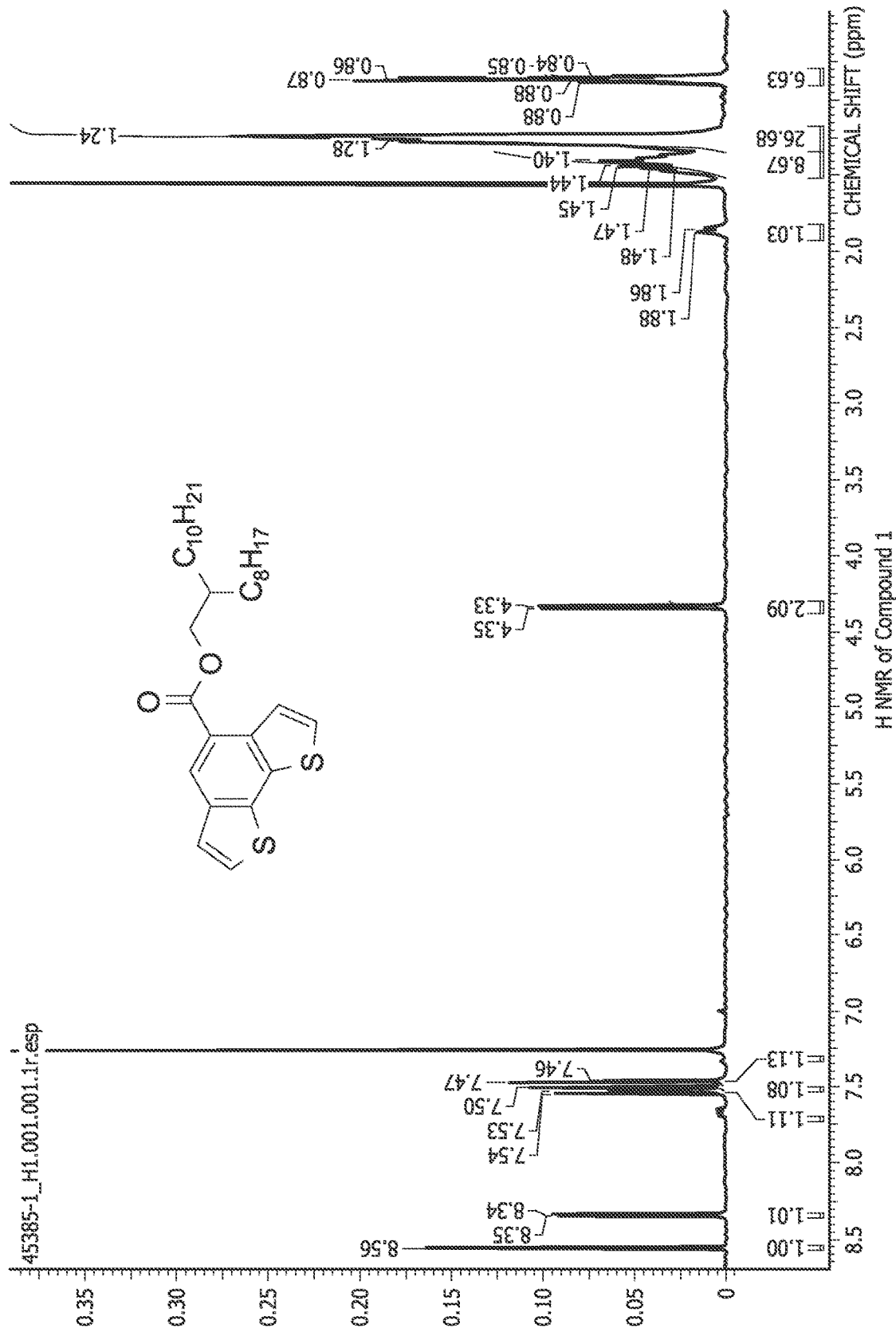
FIG. 3 depicts a 1H nuclear magnetic resonance spectrum.

In this synthesis example, compound 1 (in FIG. 2) was produced by having potassium carbonate added to a hot, oven-dried Schlenk flask; the flask was evacuated, then refilled with argon. 3-thiopheneacetic acid and dry dimethylformamide were added, followed by palladium(II) acetate, triphenylphosphine, and 2-bromothiophene-3-carbaldehyde. The reaction was heated to 110° C. and stirred for 20 hours under argon. The reaction was then cooled to and treated with 2-octyldodecyl bromide and tetrabutylammonium iodide. The reaction continued stirring at 50° C. for 24 hours, then cooled to room temperature. The reaction mixture was filtered through a small (1") plug of silica gel, then rinsed with dichloromethane until the filtrate ran clear. The solvent was removed by rotovap, and the crude material was applied to a 200 g Biotage column and eluted with a 0-10% dichloromethane (DCM)/hexanes gradient. The product, compound 1 (4.95 g, 9.6 mmol, 48% yield) was obtained as a yellow oil. GC-MS showed 99% purity. The 1H nuclear magnetic resonance (NMR) spectrum is shown in FIG. 3.

Figure 4:
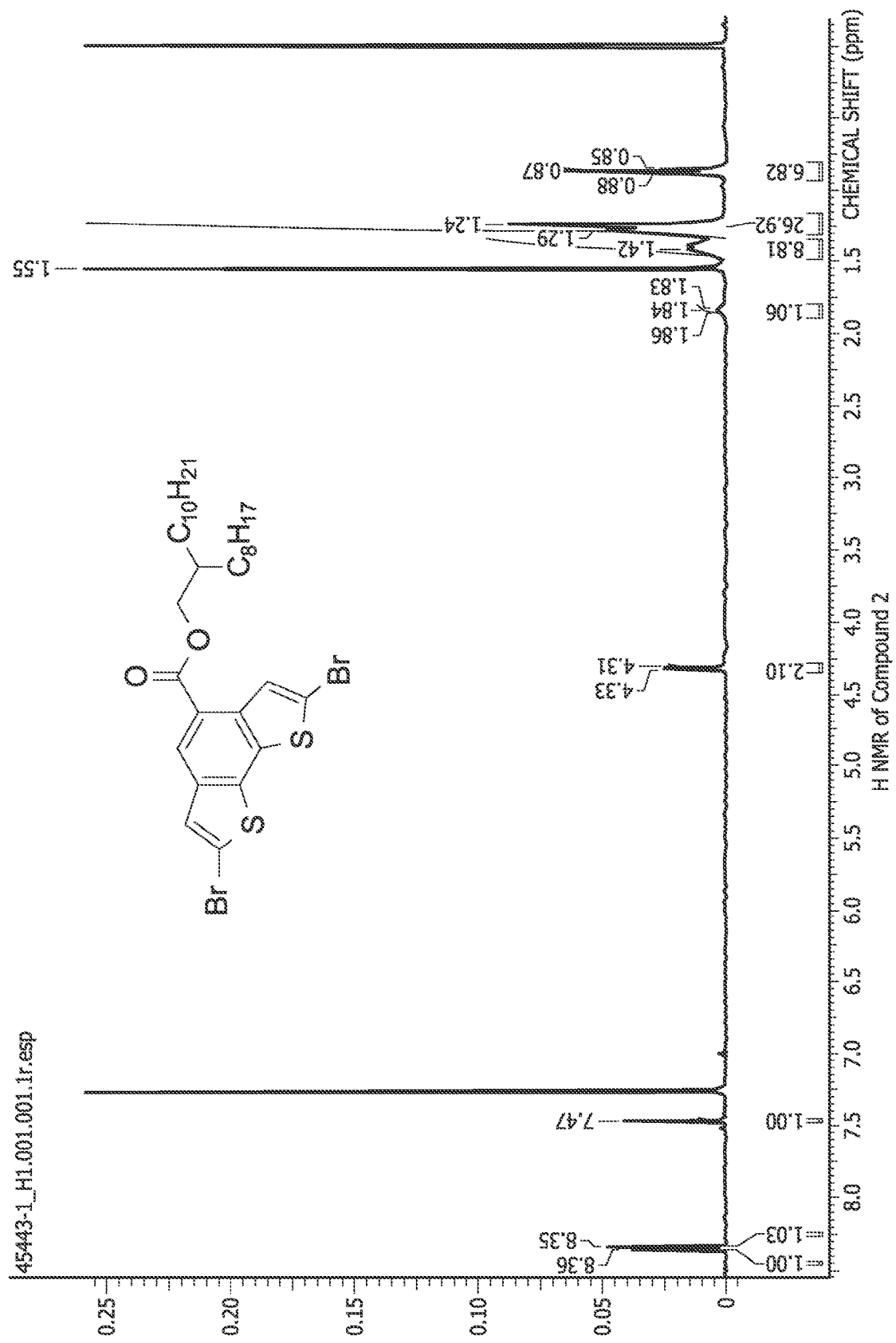
FIG. 4 depicts a 1H nuclear magnetic resonance spectrum.

In this synthesis example, compound 2 was produced by combining compound 1 and dry tetrahydrofuran. The solution was cooled to −78° C. and treated dropwise with a solution of lithium diisopropylamide. The reaction was stirred at −78° C. for 90 minutes, then treated slowly with a solution of carbon tetrabromide in dry THF. The reaction was gradually warmed to room temperature and stirred. The reaction was quenched with water and THF was removed via rotovap. The solution was diluted with hexanes and transferred to a separatory funnel. The organic layer was washed with water, then dried over MgSO4, filtered, and concentrated. The crude material was purified on a 200 g Biotage silica gel column, eluting with a 0-30% DCM/hexanes gradient. The gradient was held at 20% DCM while the product eluted. The product, compound 2 (3.31 g, 4.9 mmol, 51% yield) was a yellow oil that solidified after refrigeration. The 1H NMR spectrum is shown in FIG. 4.

Figure 5:
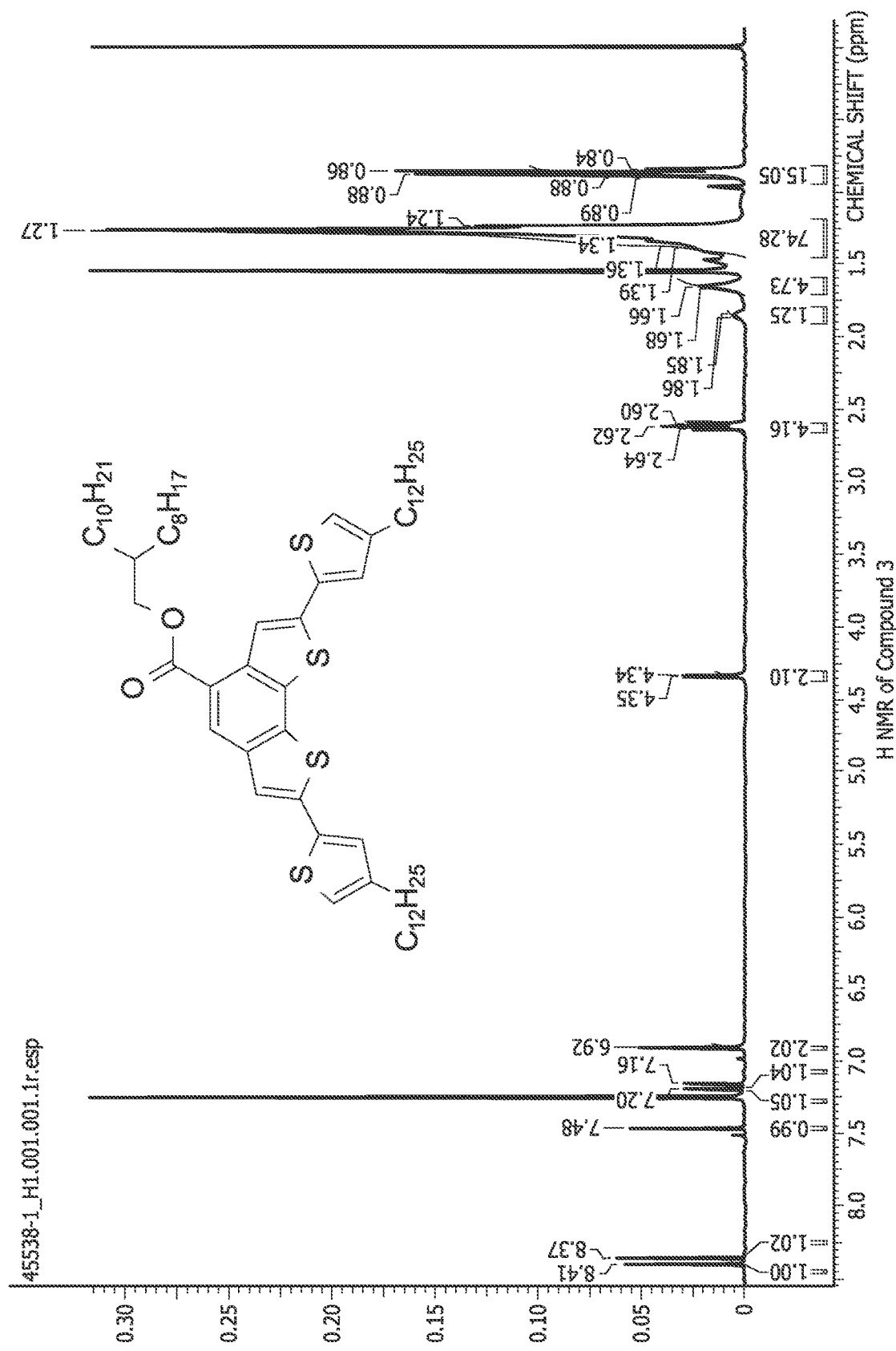
FIG. 5 depicts a 1H nuclear magnetic resonance spectrum.

In this synthesis example, compound 3 was produced by combining 2-(trimethylstannyl)-4-dodecylthiophene, compound 2, tris(dibenzylideneacetone)dipalladium(0), and tri(o-tolyl)phosphine in a Schlenk flask. The flask was evacuated and refilled with argon. Dry toluene was added, and the reaction was heated to 100° C. for 16 hours. The reaction mixture was filtered through a short (1") silica gel plug and rinsed with DCM. The solvent was removed via rotovap, and the residue was purified. The residue was diluted with hexanes, applied to a 200 g Biotage column, and eluted with 0-50% DCM/hexanes gradient to afford the product, compound 3 (1.41 g, 1.4 mmol, 47% yield), as an orange oil. The 1H NMR spectrum is shown in FIG. 5.

Figure 6:
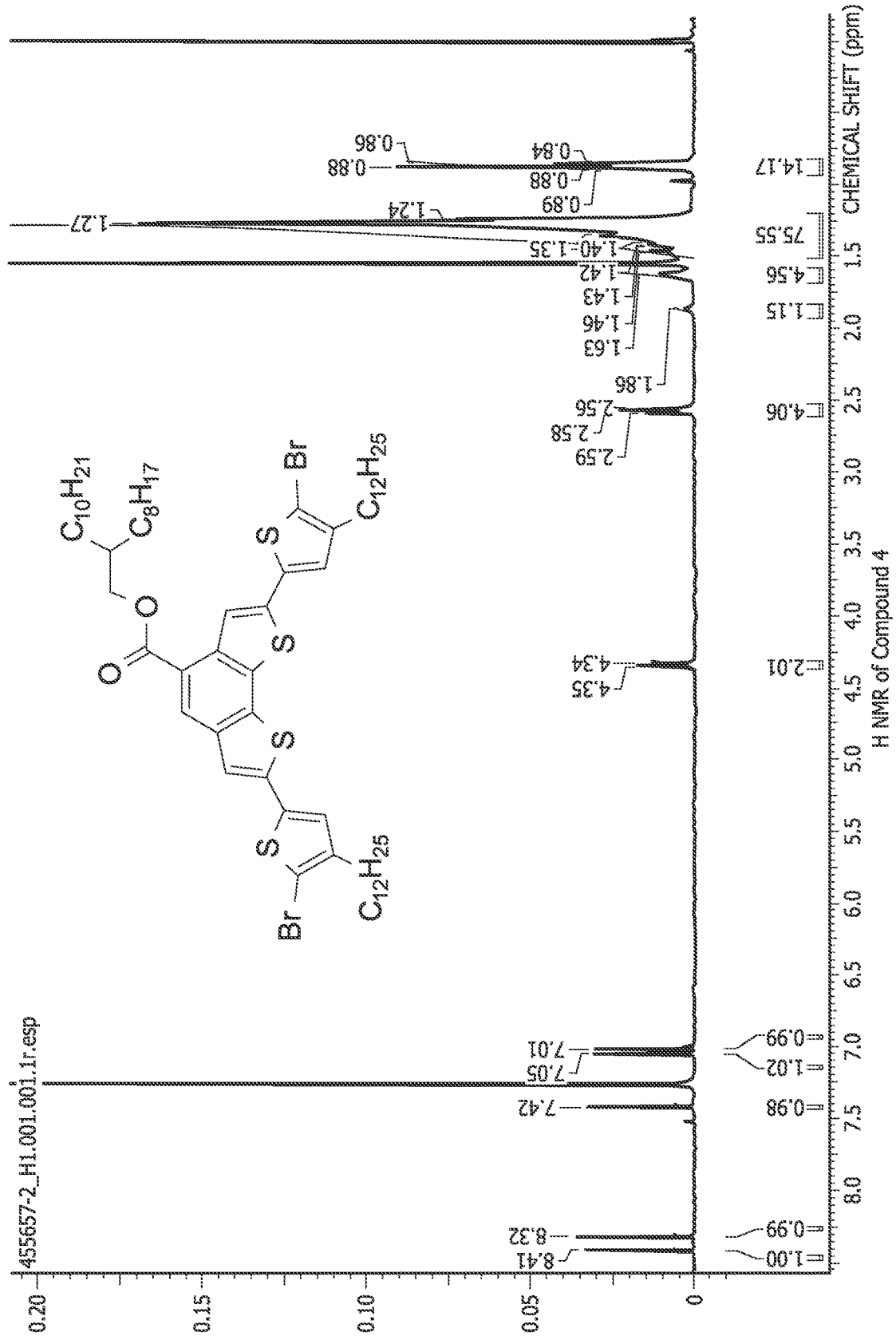
FIG. 6 depicts a 1H nuclear magnetic resonance spectrum.

In this synthesis example, compound 4 was produced by combining compound 3 in THF while cooling and treating with N-Bromosuccinimide. The reaction was gradually warmed to room temperature and stirred for 16 hours. The solvent was removed, and the residue was purified on a 200 g Biotage column with a 0-25% DCM/hexanes gradient to afford the desired product, compound 4 (1.36 g, 1.16 mmol, 83% yield). The 1H NMR spectrum is shown in FIG. 6.

Polymer Formation

Figure 7:
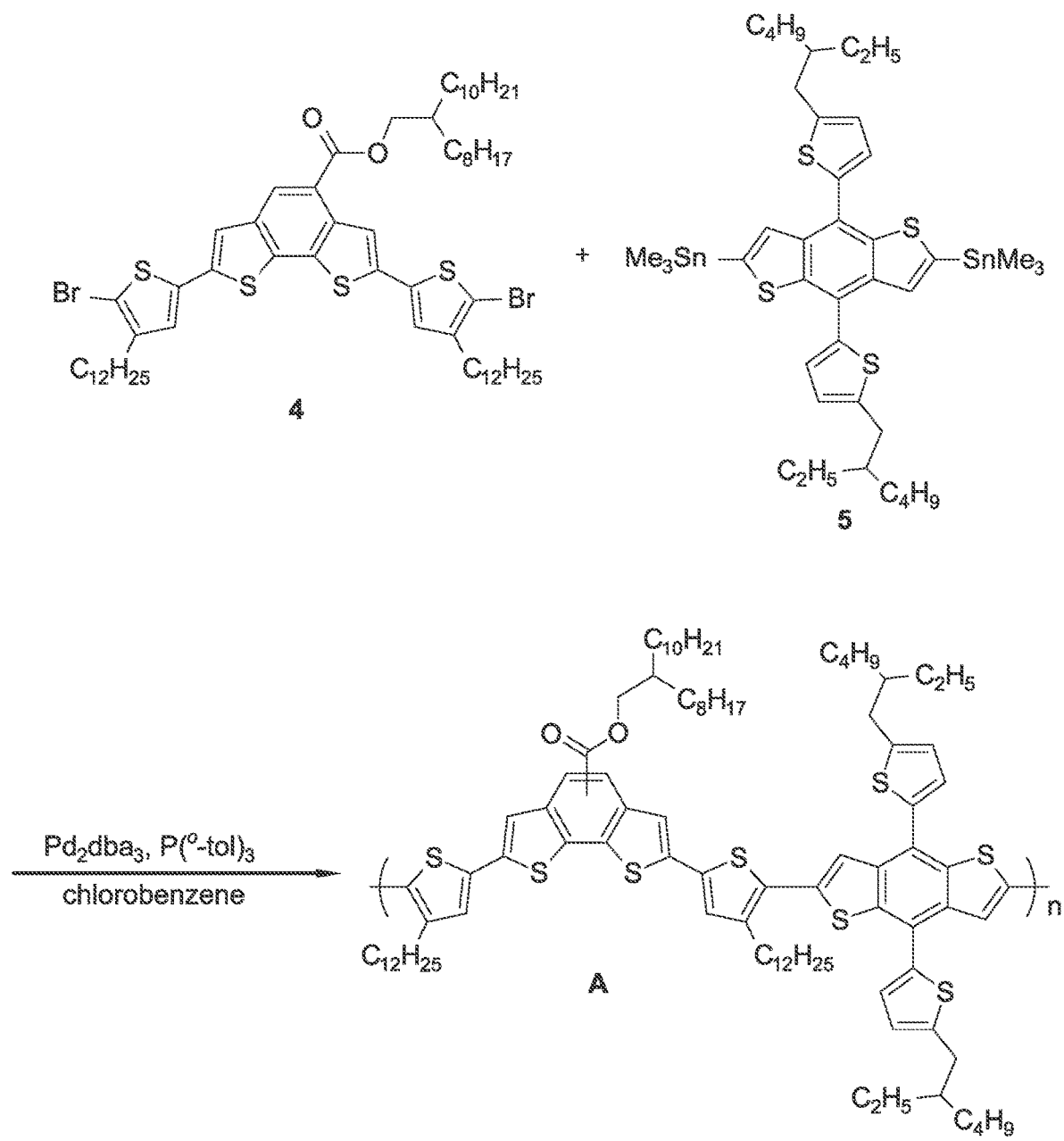
FIG. 7 depicts the formation of polymer A.

Polymer A= As shown in FIG. 7, monomer 4 (0.09 mmol) and monomer 5 (0.09 mmol) were combined with tris(dibenzylideneacetone)dipalladium(0) and tri(o-tolyl)phosphine. The flask was evacuated, then refilled with argon. Dry chlorobenzene was added, and three freeze-pump-thaw cycles were completed using liquid nitrogen to freeze the solution. The reaction was heated to 120° C. and stirred under argon. The polymer was purified by Soxhlet extraction, washing sequentially with acetone, hexanes, and chloroform. The polymer, A (135 mg, 92% yield), was collected from chloroform.

Figure 8:
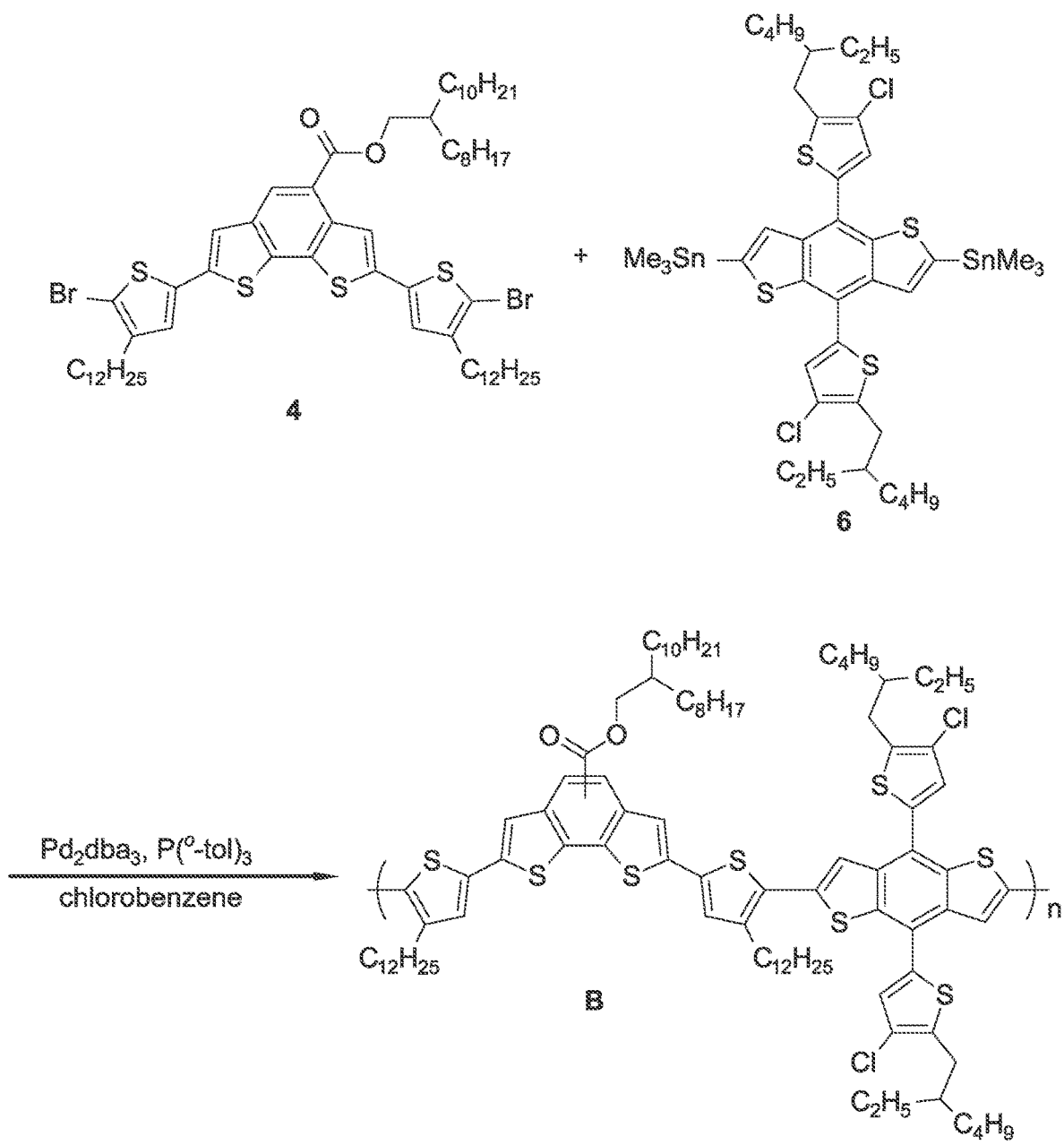
FIG. 8 depicts the formation of polymer B.

Polymer B= As shown in FIG. 8, monomers 4 (0.06 mmol) and monomer 6 (0.06 mmol) were combined with tris(dibenzylideneacetone)dipalladium(0) and tri(o-tolyl)phosphine. The flask was evacuated for 1 h, then refilled with argon. Dry chlorobenzene was added, and three freeze-pump-thaw cycles were completed using liquid nitrogen to freeze the solution. The reaction was heated to 125° C. and stirred under argon for. The polymer was purified by Soxhlet extraction, washing sequentially with acetone, hexanes, chloroform, and chlorobenzene. The polymer, B (63 mg, 64% yield), was collected from the combined chloroform and chlorobenzene washes.

Figure 9:
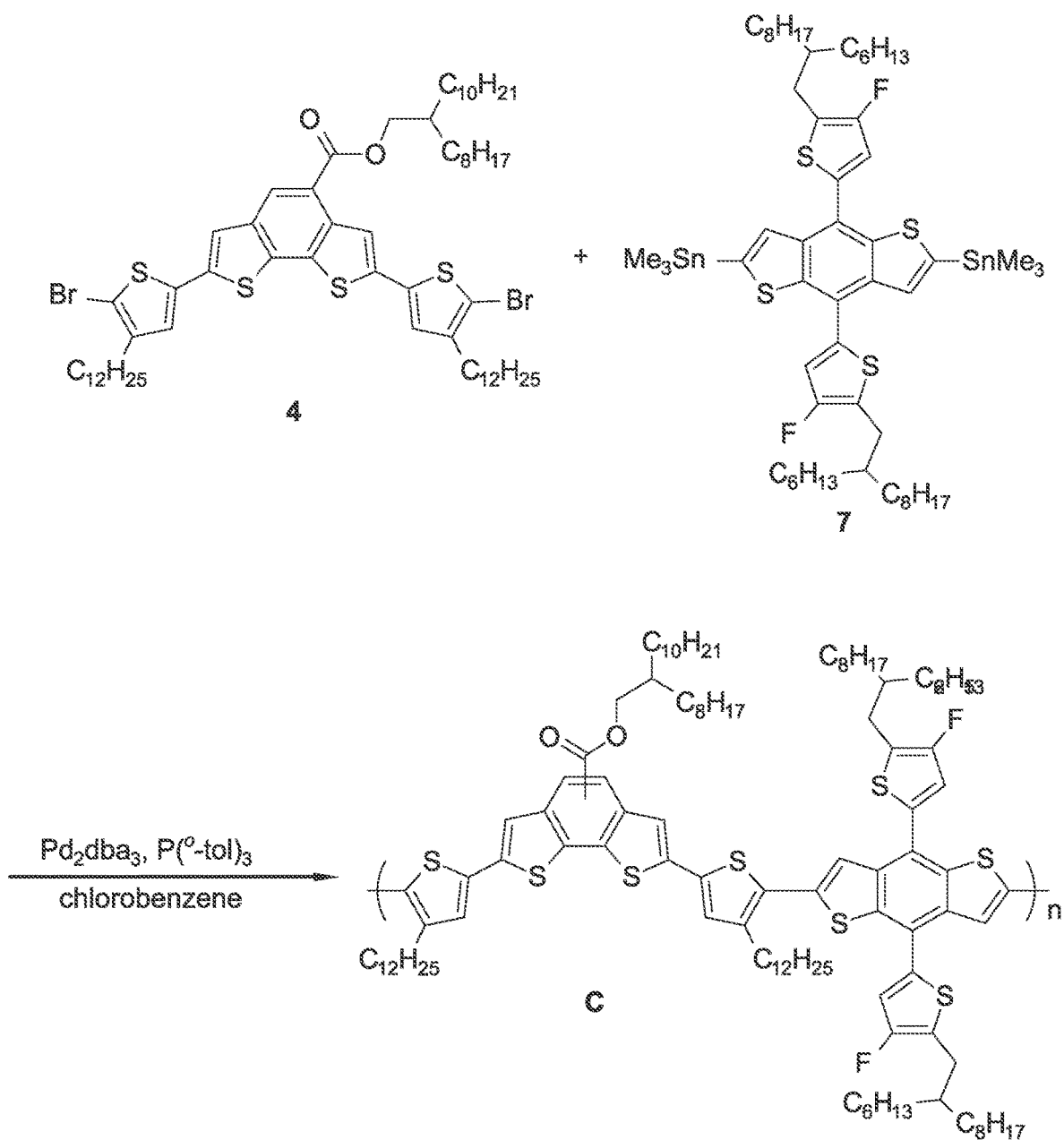
FIG. 9 depicts the formation of polymer C.

Polymer C= As shown in FIG. 9, monomer 4 (0.13 mmol) and monomer 7 (0.13 mmol) were combined with tris(dibenzylideneacetone)dipalladium(O) and tri(o-tolyl)phosphine. The flask was evacuated for 20 minutes, then refilled with argon. Dry chlorobenzene was added, and three freeze-pump-thaw cycles were performed using liquid nitrogen to freeze the solution. The reaction was heated to 120° C. for 2.5 days. The polymer was purified by Soxhlet extraction, washing sequentially with acetone, hexanes, and chloroform. The polymer, C (140 mg, 59% yield), was collected from the chloroform wash.

Figure 10:
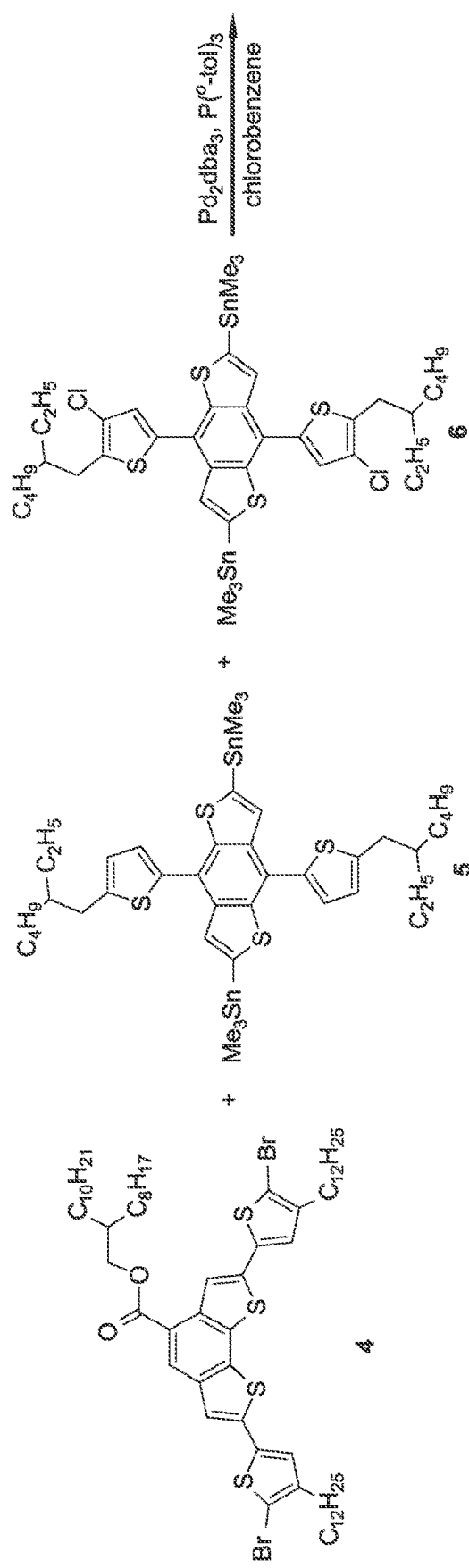
FIG. 10 depicts the formation of polymer D.
Figure 10:
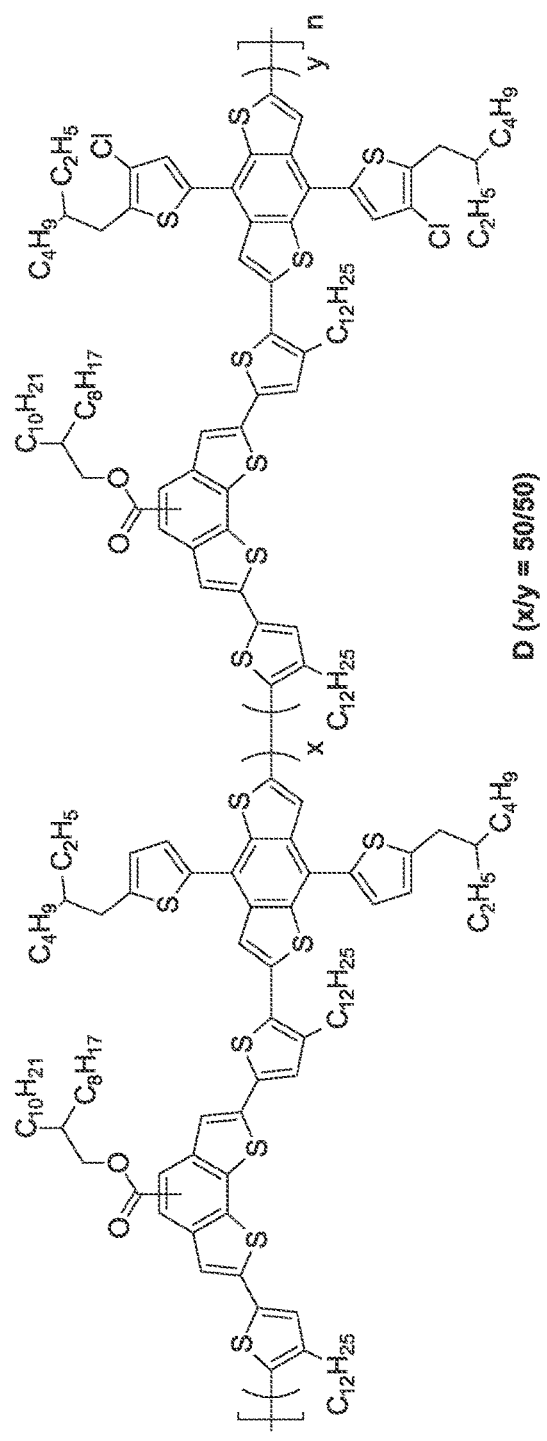

Polymer D= As shown in FIG. 10, monomer 4 (0.14 mmol), monomer 5 (0.07 mmol), and monomer 6 (0.07 mmol) were combined with tris(dibenzylideneacetone)dipalladium(0) and tri(o-tolyl)phosphine. The flask was evacuated for 20 minutes, then refilled with argon. Dry chlorobenzene was added, and three freeze-pump-thaw cycles were performed using liquid nitrogen to freeze the solution. The reaction was heated to 120° C. for 2.5 days. The polymer was purified by Soxhlet extraction, washing sequentially with acetone, hexanes, and chloroform. The polymer, D (205 mg, 92% yield), was collected from the chloroform wash.

Experimental Procedures for OPV Device Fabrication

Electron Transport Layer Deposition: Zinc-tin-oxide (ZTO) sol-gel solutions were prepared by adding zinc acetate dihydrate (996 mg) and tin (II) acetate (99.6 mg) to 2-methoxyethanol (10 mL) and ethanolamine (249 μL). Solutions were stirred for a minimum of 12 hours before use. ITO patterned glass substrates were cleaned by successive 10 min ultra-sonication in detergent (Versa-Clean), deionized water, acetone, and isopropanol. The substrates were then cleaned for 1 min in a UV-ozone chamber and the electron transport layer was immediately spin coated on the substrates. The ZTO sol-gel solution was filtered directly onto ITO with a 0.25 m poly(tetrafluoroethylene) filter and spin cast at 4,000 rpm for 40 s. Films were then annealed at 170° C. for 20 min, and directly transferred into a nitrogen filled glove box and heated at 60° C. or 110° C. prior to use.

Photoactive Layer Deposition: The photoactive layer solutions were made up of combinations of polymers and ITIC-DF with a 1:1 weight ratio in chlorobenzene. Blends with EH-IDTBR used either a 1:1.25 or 1:1.75 weight ratio in either toluene or chlorobenzene. Photoactive layer solutions had an overall concentration of 20-28 mg/mL. The solutions were heated overnight at 45° C. or 80° C. and at 60° C. or 110° C. for at least one hour prior to fabrication. The hot solutions were deposited onto pre-heated ETL-coated substrates via spin coating at 2000-4000 rpm for 40 s. Following deposition, the coated substrates were thermal annealed under nitrogen at 110° C. for 5 minutes or solvent annealed under nitrogen for 1 hour.

Hole Transport Layer and Anode Deposition: After the photoactive layer anneal, the substrates were loaded under inert atmosphere into the vacuum evaporator where MoO3 (HTL) and Ag (the anode) were sequentially deposited by thermal evaporation. Deposition occurred at a pressure of ≤5×10-6 torr. MoO3 and Ag were deposited to a thickness of 6 nm and 120 nm, respectively. The deposition rate for the MoO3 was 0.1-0.8 Å/s and Ag was 1-1.7 Å/s. Samples were then sealed with the epoxy (EPO-TEK, OG116-31) and then cured in ELC-500 UV chamber for 3 min at room temperature before testing in air.

Device Testing: Devices with an active area of 0.0656 cm2 determined from an aperture mask were tested under air mass (AM) 1.5 G 100 mW/cm2 conditions with a Newport® Thermal Oriel® 91192 1000 W solar simulator (4"×4" illumination size). The current density-voltage (J-V) curves were measured using a Keithley 2400 source meter. The light intensity was calibrated with a crystalline silicon reference photovoltaic fitted with a KG-5 filter, calibrated by the National Renewable Energy Laboratory to minimize spectral mismatch. The constant illumination aging of the devices entailed storage under AM 1.5 G 100 mW/cm2 conditions with an OAI model 0131-0293-01 solar simulator while protected with a 385 nm UV-filter.

Table 1 below demonstrates the OPV device performance of the above made polymers

TABLE 1

| Active Layer | Voc (V) | Jsc (mA/cm$^2$) | Fill Factor (%) | Power Conversion Efficiency (%) | Series Resistance (Ωcm$^2$) | Shunt Resistance (Ωcm$^2$) |
|---|---|---|---|---|---|---|
| A:ITIC-DF(1:1) | 0.69 | 16.0 | 64 | 7.0 | 6 | 940 |
| B:ITIC-DF(1:1) | 0.83 | 16.8 | 72 | 10 | 4 | 1900 |
| A:EH-IDTBR(1:1.25) | 1.00 | 12.4 | 56 | 7.0 | 9 | 400 |
| A:EH-IDTBR(1:1.75) | 0.98 | 14.3 | 60 | 8.3 | 9 | 670 |
| B:EH-IDTBR(1:1.25) | 1.15 | 10.7 | 61 | 7.6 | 8 | 930 |
| C:ITIC-DF(1:1) | 0.86 | 10.6 | 70 | 6.4 | 6 | 980 |
| D:EH-IDTBR(1:2) | 1.05 | 11.2 | 58 | 6.8 | 14 | 816 |

As shown in the table above the novel polymers can be used to produce devices that feature PCE values greater than 6.8. In some embodiments, greater than 6.9, 7.0, 7.6, 8.0, 8.5, and even 10.

Table 2 below demonstrates the OPV performance of devices before and after burn in.

TABLE 2

|  | A:ITIC-DF | B:ITIC-DF | A:EH-IDTBR | B:EH-IDTBR |
|---|---|---|---|---|
| PCE Initial (%) | 7.0 | 10.0 | 7.0 | 7.4 |
| PCE after burn-in (%) | 2.6 | 5.8 | 7.3 | 7.4 |
| PCE charge after burn-in (%) | −68% | −42% | +6% | −1% |
| Fill Factor initial (%) | 64 | 72 | 56 | 56 |
| Fill Factor after burn-in (%) | 50 | 59 | 52 | 58 |
| Fill Factor change after burn-in (%) | −21% | −18% | −8% | 4% |
| Jsc initial (mA/cm$^2$) | 16.0 | 16.8 | 12.4 | 11.8 |
| Jsc after burn-in (mA/cm$^2$) | 7.1 | 12.4 | 14.8 | 12.3 |
| Jsc change after burn-in (%) | −56% | −26% | 19% | 4% |
| Voc change after burn-in (%) | −8% | −4% | −4% | −9% |
| Series Resistance change (%) | 180% | 52% | 48% | 67% |
| Shunt Resistance change (%) | −67% | −81% | 40% | 32% |

Large Area OPV Device Fabrication

A:EH-IDTBR large area (2.5 cm2) OPVs were fabricated using scalable coating techniques. Zinc tin oxide:fullerene (ZTO:PCBNMI)4 sol gel solutions were prepared by adding zinc acetate dihydrate (996 mg), tin (II) acetate (99.6 mg), and PCBNMI (5 mg) to a 3:1:1 mixture of ethanol:dimethylsulfoxide:2-butoxyethanol (10 mL) and ethanolamine (249 μL). Solutions were stirred for a minimum of 12 hours before use. An Erichsen COATMASTER 510 was used to doctor blade the electron transport layer on the large area ITO substrates. Approximately 300 μL of the zinc tin oxide:fullerene (ZTO:PCBNMI) sol-gel solution was drawn into a pipette and deposited without filtration directly onto the ITO. The blade, with a gap height set at 300 μm, was then drawn through the ZTO:PCBNMI solution and across the ITO at a coating speed of 20 mm/s to create a uniform film on the substrate. The films were air dried for 15 min before the substrates were removed from the chuck and annealed at 170° C. for 15 min.

A FOM Technologies—Compact Sheet Coater was used to slot-die coat the photoactive layer onto the electron transport layer on the ITO substrates. The photoactive layers were prepared in toluene by dissolving A and EH-IDTBR with a polymer to acceptor ratio of 1:1.75 and a total concentration of either 24 or 18 mg/mL. The solutions were stirred overnight at 80° C. prior to use. The photoactive layer solution was stirred at room temperature to cool before drawing several mL through a 1/16" ID FEP tube and into a 5-mL Luer lock syringe without filtration. Care was taken to remove bubbles from the syringe and tube by expelling some of the solution back into the vial. The syringe was placed into the slot-die pump at a syringe diameter setting of 36 mm and the tube was connected to the blade feed. The 1.3 cm wide blade was positioned above the substrate (temperature held at 45° C.) with a 200 μm gap height. For both ink concentrations a coating speed of 20 cm/min, and a pump speed of 0.02 mL/min were used. After coating, the photoactive layer films were allowed to anneal at the substrate deposition temperature (45° C.) until dry.

Following annealing, deposition of the hole transport layer and the anode were performed. The hole transport layer (MoO3) and anode (Ag) were sequentially deposited via thermal evaporation. Deposition occurred at a pressure of 1-2×10-6 torr. MoO3 and Ag had a thickness of 6 nm and 120 nm, respectively. The deposition rate was 0.5-0.7 Å/s MoO3 and 1.5-2 Å/s for Ag.

Cells with an active area of 2.5 cm2 were tested under AM 1.5 G 100 mW/cm2 conditions with a Newport Thermal Oriel 91192 1000 W solar simulator (4"×4" illumination size). The current density-voltage curves were measured using a Keithley 2400 source meter. The light intensity was calibrated with a crystalline silicon reference photovoltaic (area=0.4957 cm2) fitted with a KG-5 filter (calibrated by Newport to minimize spectral mismatch). To evaluate stability, unencapsulated large area cells coated using 24 mg/mL solutions were placed in a nitrogen filled box and illuminated constantly for 250 hours. Periodically, the devices were removed from the nitrogen box and the photovoltaic performance was measured as noted above.

Performance for large area (2.5 cm$^2$) A:EH-IDTBR OPV device are shown in Table 3 below.

TABLE 3

| Concentration | Voc(V) | Jsc(mA/cm$^2$) | FF(%) | PCE(%) |
|---|---|---|---|---|
| 24 mg/mL | 0.875 | 7.42 | 34.0 | 2.21 |
| 18 mg/mL | 0.870 | 5.45 | 30.6 | 1.45 |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:
1. A method comprising:
    combining

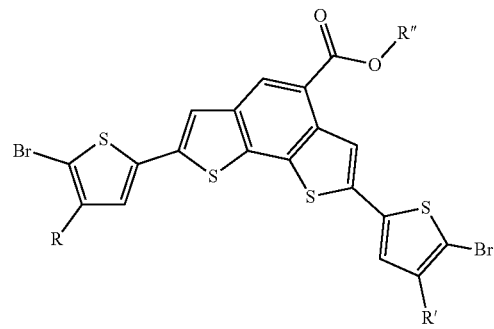

and Me$_3$Sn—X—SnMe$_3$ to form a solution containing a polymer

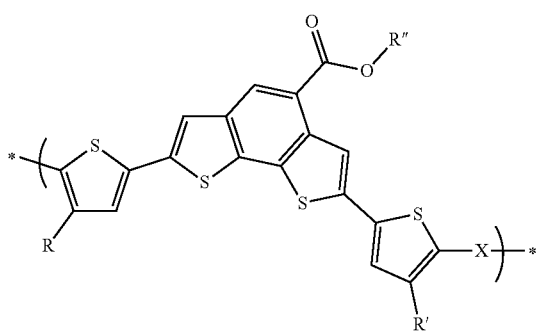

wherein R, R', and R" are independently selected from the group consisting of: H, Cl, F, CN, alkyl, alkoxy, alkylthio, ester, ketone and aryl groups; and wherein X is selected from aryl groups.

2. The method of claim 1, wherein the polymer is used as photovoltaic material in one or more photovoltaic devices.

3. The method of claim 2, wherein the one or more photovoltaic devices are polymer solar cell devices or photodetector devices.

4. The method of claim 1, wherein the polymer is used as an active layer material in one or more electronic devices.

5. The method of claim 4, wherein the one or more electronic devices are field effect transistors, light emitting devices and sensors, electrochromic devices and capacitors.

6. The method of claim 1, wherein R and R' are identical.

7. The method of claim 1, wherein R, R' and R" are not identical.

8. The method of claim 1, wherein X and X' are identical.

9. The method of claim 1, wherein X and X' are not identical.

10. The method of claim 1, wherein the aryl groups are selected from

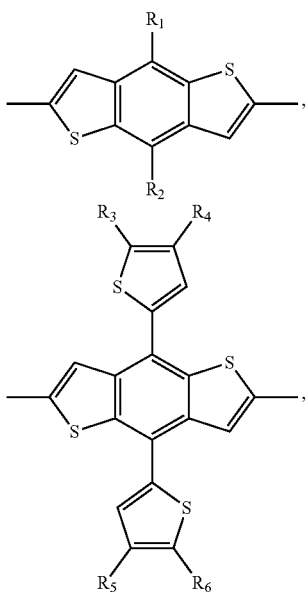

and combinations thereof, wherein $R_1$, $R_2$, $R_3$, $R_4$, $R_5$, and $R_6$ are independently selected from H, Cl, F, CN, alkyl, alkoxy, alkylthio, ester, ketone and aryl groups.

11. The method of claim 1, wherein the method combines tris(dibenzylideneacetone)dipalladium(0) and tri(o-tolyl)phosphine with

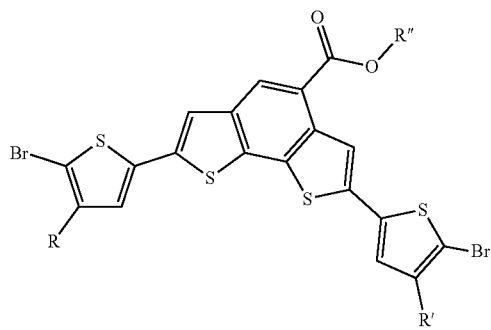

and $Me_3Sn$—X—$SnMe_3$.

12. The method of claim 1, wherein the mole ratio of

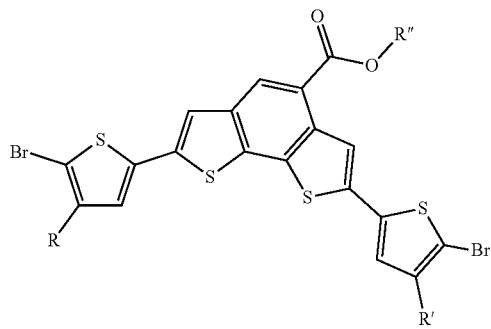

and $Me_3Sn$—X—$SnMe_3$ are substantially identical.

13. The method of claim 1, wherein the solution is heated to a temperature greater than 100° C.

14. The method of claim 1, wherein the solution is purified to extract the monomer.

15. A method comprising:

combining

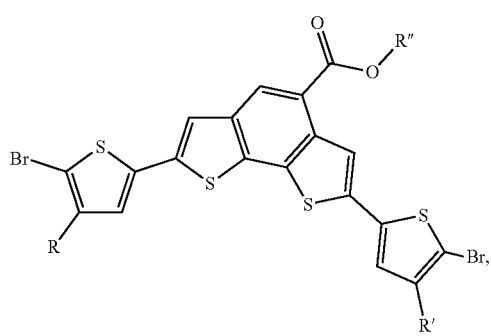

Me$_3$Sn—X—SnMe$_3$, and Me$_3$Sn—X'—SnMe$_3$ to form
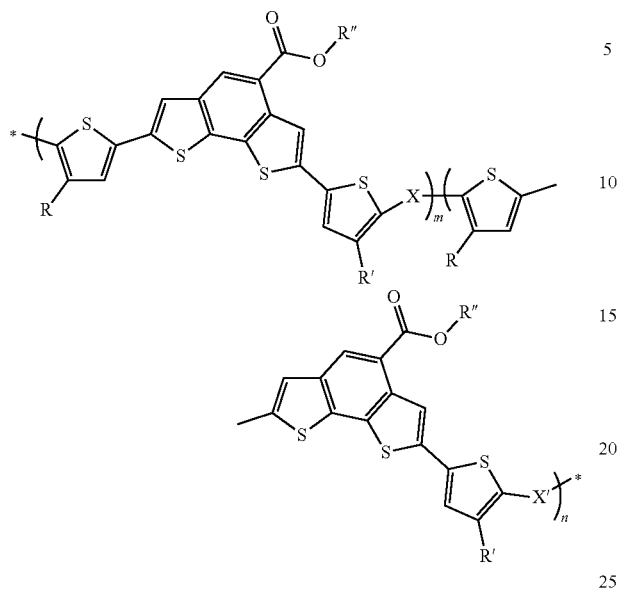
wherein R, R', and R" are independently selected from the group consisting of: H, Cl, F, CN, alkyl, alkoxy, alkylthio, ester, ketone and aryl groups;
wherein X and X' are independently selected from aryl groups; and
wherein m independently ranges from 1 to 100 percent and n independently ranges from 0 to 99 percent.
* * * * *